United States Patent
Tsuchihashi

(10) Patent No.: US 7,859,805 B2
(45) Date of Patent: Dec. 28, 2010

(54) ELECTROSTATIC BREAKDOWN PROTECTION CIRCUIT AND SEMICONDUCTOR INTEGRATED CIRCUIT DEVICE THEREWITH

(75) Inventor: Masanori Tsuchihashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 483 days.

(21) Appl. No.: 11/912,412

(22) PCT Filed: Dec. 5, 2006

(86) PCT No.: PCT/JP2006/324193

§ 371 (c)(1),
(2), (4) Date: Oct. 24, 2007

(87) PCT Pub. No.: WO2007/066626

PCT Pub. Date: Jun. 14, 2007

(65) Prior Publication Data

US 2009/0080128 A1    Mar. 26, 2009

(30) Foreign Application Priority Data

Dec. 7, 2005   (JP) .............................. 2005-353163

(51) Int. Cl.
*H02H 9/00* (2006.01)
(52) U.S. Cl. ........................................................ 361/56
(58) Field of Classification Search .................... 361/56
See application file for complete search history.

(56) References Cited

U.S. PATENT DOCUMENTS

| | | | |
|---|---|---|---|
| 4,418,291 A * | 11/1983 | Watson, Jr. ................. | 326/23 |
| 5,644,460 A | 7/1997 | Clukey | |
| 5,946,177 A * | 8/1999 | Miller et al. .................. | 361/56 |
| 6,101,077 A | 8/2000 | Matsumoto et al. | |
| 6,147,538 A | 11/2000 | Andresen et al. | |
| 6,229,182 B1 | 5/2001 | Van Lieverloo | |
| 6,954,098 B2 * | 10/2005 | Hsu et al. .................... | 327/313 |
| 2001/0053054 A1 * | 12/2001 | Andoh ......................... | 361/56 |
| 2002/0027755 A1 * | 3/2002 | Andresen et al. ............. | 361/56 |
| 2003/0197543 A1 | 10/2003 | Imai | |
| 2005/0045955 A1 * | 3/2005 | Kim et al. .................... | 257/355 |
| 2005/0200396 A1 | 9/2005 | Hsu et al. | |
| 2005/0231866 A1 * | 10/2005 | Mergens et al. ............... | 361/56 |

FOREIGN PATENT DOCUMENTS

JP     02-274124     11/1990

(Continued)

*Primary Examiner*—Jared J Fureman
*Assistant Examiner*—Angela Brooks
(74) *Attorney, Agent, or Firm*—Fish & Richardson P.C.

(57) ABSTRACT

A protection circuit according to the present invention includes: a diode (D1) having an anode thereof connected to a gate signal input terminal and a cathode thereof connected to the gate of an output transistor (N1); a resistor (R1) having one end thereof connected to the gate signal input terminal and the other end thereof connected to ground; a PNP bipolar transistor (Qp1) having the emitter, base and collector thereof connected to the gate of the output transistor (N1), the one end of the resistor (R1) and ground, respectively. With this configuration, it is possible to prevent, without the need for electric power, an open-drain output transistor from erroneously turning on as a result of an electrostatic pulse or the like being applied thereto, and thus to protect the output transistor from electrostatic breakdown.

6 Claims, 4 Drawing Sheets

FOREIGN PATENT DOCUMENTS

| | | |
|---|---|---|
| JP | 05-327456 | 12/1993 |
| JP | 10-224201 | 8/1998 |
| JP | 11-054711 | 2/1999 |
| JP | 2003-316455 | 11/2003 |
| TW | 429588 | 4/2001 |
| TW | 520563 | 2/2003 |
| TW | 1220312 | 8/2004 |
| TW | 1240406 | 9/2005 |
| TW | 1241010 | 10/2005 |

* cited by examiner

ELECTROSTATIC BREAKDOWN PROTECTION CIRCUIT AND SEMICONDUCTOR INTEGRATED CIRCUIT DEVICE THEREWITH

TECHNICAL FIELD

The present invention relates to an electrostatic breakdown protection circuit for protecting an open-drain output transistor from electrostatic breakdown, and also relates to a semiconductor integrated circuit device incorporating such an electrostatic breakdown protection circuit.

BACKGROUND ART

Conventionally, in semiconductor integrated circuit devices, output circuits incorporating, as logic signal outputting means, open-drain output transistors are widely used.

Disadvantageously, however, in the output circuit mentioned above, if a sharply rising pulse (such as an electrostatic pulse) is applied to an output terminal (i.e., the drain of the output transistor), the gate potential of the output transistor is raised through parasitic capacitance or the like present between the gate and drain of the output transistor. Thus, the output transistor is erroneously turned on to cause an overcurrent to flow between the source and drain thereof. This may lead to breakdown of the output transistor.

As described above, output circuits incorporating open-drain output transistors offer simple circuit configurations, but disadvantageously have poor resistance to electrostatic breakdown. Thus, conventional semiconductor integrated circuit devices adopt various configurations designed to reduce the overcurrent described above, such as those where, as means for protecting output transistors from electrostatic breakdown, a current-limiting resistor is provided between the drain of the output transistor and an output terminal, or a clamp circuit like a Zener diode is provided between the gate of the output transistor and ground.

As another conventional technology related to the present invention, the applicant of the invention discloses and proposes an output circuit (see patent document 1 below) including a switch circuit that operates when the potential difference between an output terminal and a power line is beyond a predetermined level; when this switch circuit operates, an output transistor is driven to conduct between ground and the output terminal.

Patent document 1: JP-A-H02-274124

DISCLOSURE OF THE INVENTION

Problems to be Solved by the Invention

To be sure, with a semiconductor integrated circuit device adopting any of the conventional technologies described above, by reducing an overcurrent flowing through an output transistor, it is possible to decrease the possibility of the output transistor being destroyed.

However, all these conventional technologies simply reduce an overcurrent flowing through an output transistor on the assumption that the output transistor erroneously turns on as a result of an electrostatic pulse or the like being applied thereto. Thus, none of these conventional technologies is one that fundamentally prevent electrostatic breakdown (one that fundamentally prevents an output transistor from tuning on erroneously).

The conventional technology of patent document 1 is developed with consideration given only to the prevention of electrostatic breakdown in a semiconductor integrated circuit device in its normal operating state (in a state where electric power is being supplied thereto), but with no consideration given to the prevention of electrostatic breakdown in a semiconductor integrated circuit device in its isolated state (in a state where electric power is not being supplied thereto).

An object of the present invention is to provide an electrostatic breakdown protection circuit that prevents, without the need for electric power, an open-drain output transistor from erroneously turning on as a result of an electrostatic pulse or the like being applied thereto, and that thus protects the open-drain output transistor from electrostatic breakdown, and to provide a semiconductor integrated circuit device incorporating such an electrostatic breakdown protection circuit.

Means for Solving the Problem

To achieve the above object, according to one aspect of the present invention, an electrostatic breakdown protection circuit for protecting an open-drain output transistor from electrostatic breakdown includes: a diode having an anode thereof connected to a signal input terminal leading to the output transistor and a cathode thereof connected to the gate of the output transistor; a first resistor having one end thereof connected to the signal input terminal and the other end thereof connected to ground; and a PNP bipolar transistor or a P-channel field effect transistor having an emitter or a source, a base or a gate and a collector or a drain connected to the gate of the output transistor, the one end of the first resistor and ground, respectively (a first configuration).

The electrostatic breakdown protection circuit of the first configuration may further include a clamp element connected in parallel to the output transistor, the trigger voltage of the clamp element being set lower than the design withstand voltage of the output transistor (a second configuration).

The electrostatic breakdown protection circuit of any one of the first and second configurations may further include: a second resistor connected between the collector of the PNP bipolar transistor or the drain of the P-channel field effect transistor and ground; and a plurality of stages of NPN bipolar transistors connected in a Darlington configuration between the gate of the output transistor and ground, a first stage one of the NPN bipolar transistors having a base thereof connected to one end of the second resistor (a third configuration).

According to another aspect of the invention, a semiconductor integrated circuit device includes an open-drain output transistor, an inverter for inputting a signal to the gate of the output transistor and an electrostatic breakdown protection circuit for protecting the output transistor from electrostatic breakdown. Here, the semiconductor integrated circuit device includes, as the above-mentioned electrostatic breakdown protection circuit, the electrostatic breakdown protection circuit of any one of the first and second configurations (a fourth configuration).

ADVANTAGES OF THE INVENTION

With an electrostatic breakdown protection circuit according to the invention, it is possible to prevent, without the need for electric power, an open-drain output transistor from erroneously turning on as a result of an electrostatic pulse or the like being applied thereto and thus to protect the open-drain output transistor from electrostatic breakdown. This leads to improved reliability and handleability of a semiconductor integrated circuit device incorporating such an electrostatic breakdown protection circuit.

LIST OF REFERENCE SYMBOLS

| | |
|---|---|
| 1 | Logic circuit |
| 2 | Pre-driver |
| 3 | Driver |
| 4 | FG signal output circuit |
| 5 | Regulator |
| 6 | Hall comparator |
| 41 | Electrostatic breakdown protection circuit |
| N1 | N-channel field effect transistor (output transistor) |
| N2 and N3 | N-channel field effect transistor |
| P1 | P-channel field effect transistor |
| D1 | Diode |
| R1 to R3 | Resistor |
| Qp1 | PNP bipolar transistor |
| Qn1 to Qn4 | NPN bipolar transistor |
| CL | Clamp element |

BEST MODE FOR CARRYING OUT THE INVENTION

Hereinafter, a description will be given of an example where the present invention is applied to a motor driver IC for controlling driving of a motor (such as a paper feed motor for a printer or facsimile machine).

Figure 1:
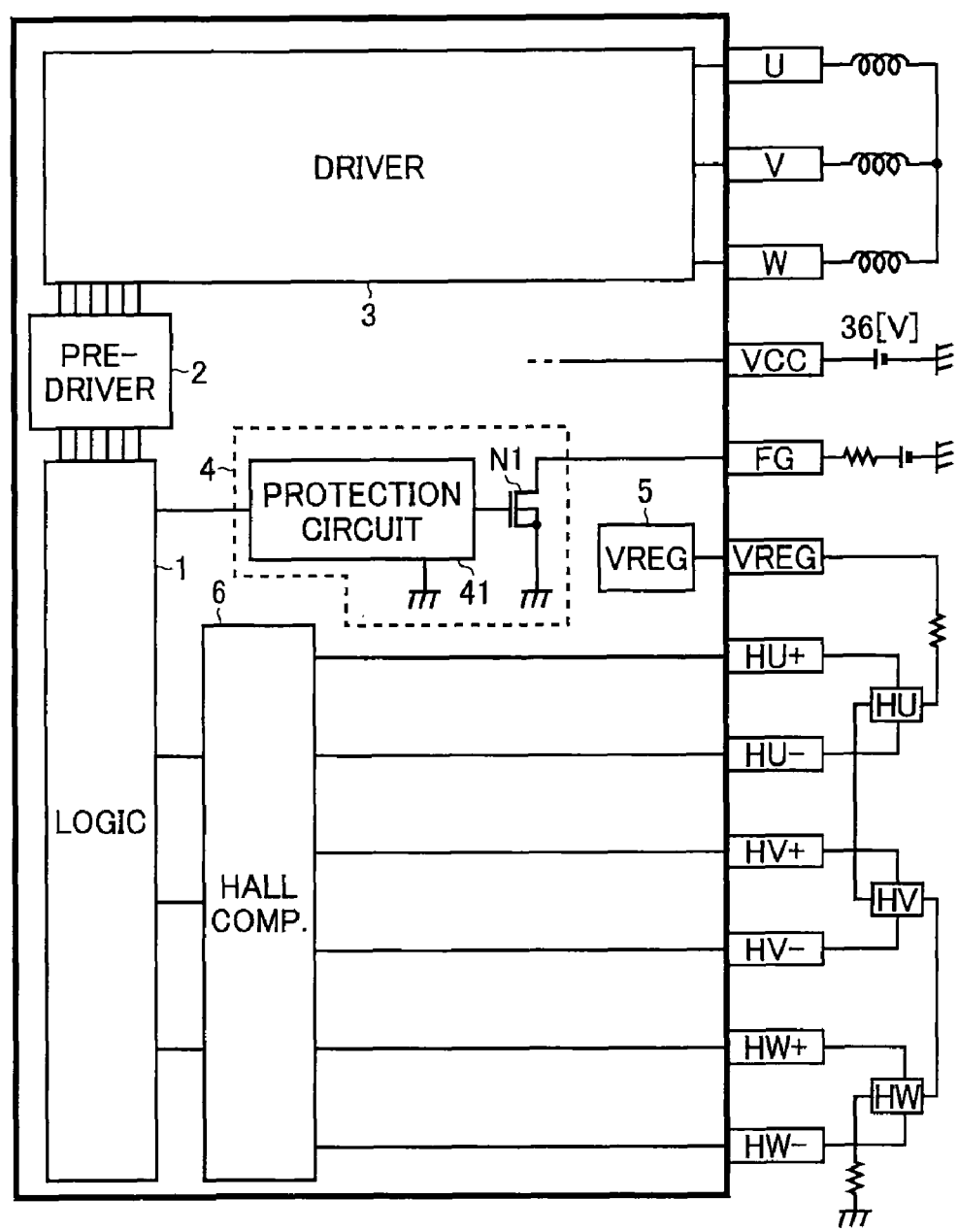
FIG. 1 A layout diagram schematically showing the configuration of a motor driver IC according to the invention.

FIG. 1 is a layout diagram schematically showing the configuration of a motor driver IC according to the invention. As shown in FIG. 1, the motor driver IC of this embodiment has, as means for electrically connecting to the outside of the IC, various external terminals (U, V, W, VCC, FG, VREG, HU+, HU−, HV+, HV−, HW+ and HW−).

The motor driver IC of this embodiment has, as its circuit elements, a logic circuit 1, a pre-driver 2, a driver 3, an FG signal output circuit 4, a regulator 5 and a Hall comparator 6.

The U, V and W terminals serve as external terminals through which drive signals are fed to motor coils for three phases (U, V and W phases) of the motor, respectively. Since high voltages are applied as the drive signals to these external terminals, they are designed to withstand high voltages.

The VCC terminal serves as an external terminal through which electric power is received from a power line outside the IC. Since a high voltage (e.g., 36 V at the maximum) is applied as an input voltage to the VCC terminal, it is designed to withstand high voltages.

The FG terminal serves as an external terminal through which a control pulse signal (FG signal) is fed to the outside of the IC. A pull-up resistor is externally connected between the FG terminal and the power line.

The VREG terminal serves as an external terminal through which a constant voltage generated by the regulator circuit 5 is fed as a supply voltage to Hall elements for the individual phases.

The HU+, HU−, HV+, HV−, HW+ and HW− terminals serve as external terminals through which to receive Hall signals of the individual phases from the three-phase Hall elements (HU, HV and HW) outside the IC.

The logic circuit 1 serves as means for controlling, in a centralized fashion, overall operations (such as those for FG signal output control by use of the FG signal output circuit 4, for constant-speed driving control and phase control of the motor based on output signals of the individual phases from the Hall comparator 6 and for various kinds of circuit protection control) in the motor driver IC. Here, the constant-speed driving control and phase control of the motor will be described specifically. The logic circuit 1 generates pre-drive signals (uh, ul, vh, vl, wh and wl) of the individual phases of the motor to feed these signals to the pre-driver 2 while controlling the motor rotation speed and the phase feedback based on the output signals of the individual phases from the Hall comparator 6.

The pre-driver 2 serves as means for shifting the level of and shaping the waveform of the pre-drive signals (uh, ul, vh. vl, wh and wl) received from the logic circuit 1 to generate drive signals (UH, UL, VH, VL, WH and WL) of the individual phases of the motor, and for feeding these signals to the driver 3.

The driver 3 serves as means for driving the motor with power transistors (unillustrated) connected in an H-bridge configuration. The power transistors are turned on and off according to the drive signals (UH, UL, VH, VL, WH and WL) fed to their gates to drive the motor connected to the U, V and W terminals externally.

The FG signal output circuit 4 includes, as an output transistor, an open-drain N-channel field effect transistor N1. The FG signal output circuit 4 turns on and off the transistor N1 according to an input signal from the logic circuit 1 to generate an FG signal having a frequency commensurate with the rotation rate of the motor, and feeds this FG signal to the outside of the IC via the FG terminal. The FG signal output circuit 4 of this embodiment includes, as means for protecting the output transistor N1 from electrostatic breakdown, an electrostatic breakdown protection circuit 41 according to the invention. The configuration and operation of the electrostatic breakdown protection circuit 41 will be described in detail later.

The regulator 5 serves as voltage conversion means for generating a desired output voltage from the input voltage applied thereto via the VCC terminal to feed the output voltage as a supply voltage via the VREG terminal to the Hall elements for the individual phases.

The Hall comparator 6 compares sinusoidal Hall signals (+/−) of the individual phases as applied thereto via the HU (+/−), HV (+/−) or HW (+/−) terminals with each other so as to generate rectangular output signals of the individual phases, and feeds these rectangular output signals of the individual phases to the logic circuit 1.

Next, the configuration and operation of the electrostatic breakdown protection circuit 41 of a first embodiment will be described in detail with reference to FIG. 2.

Figure 2:
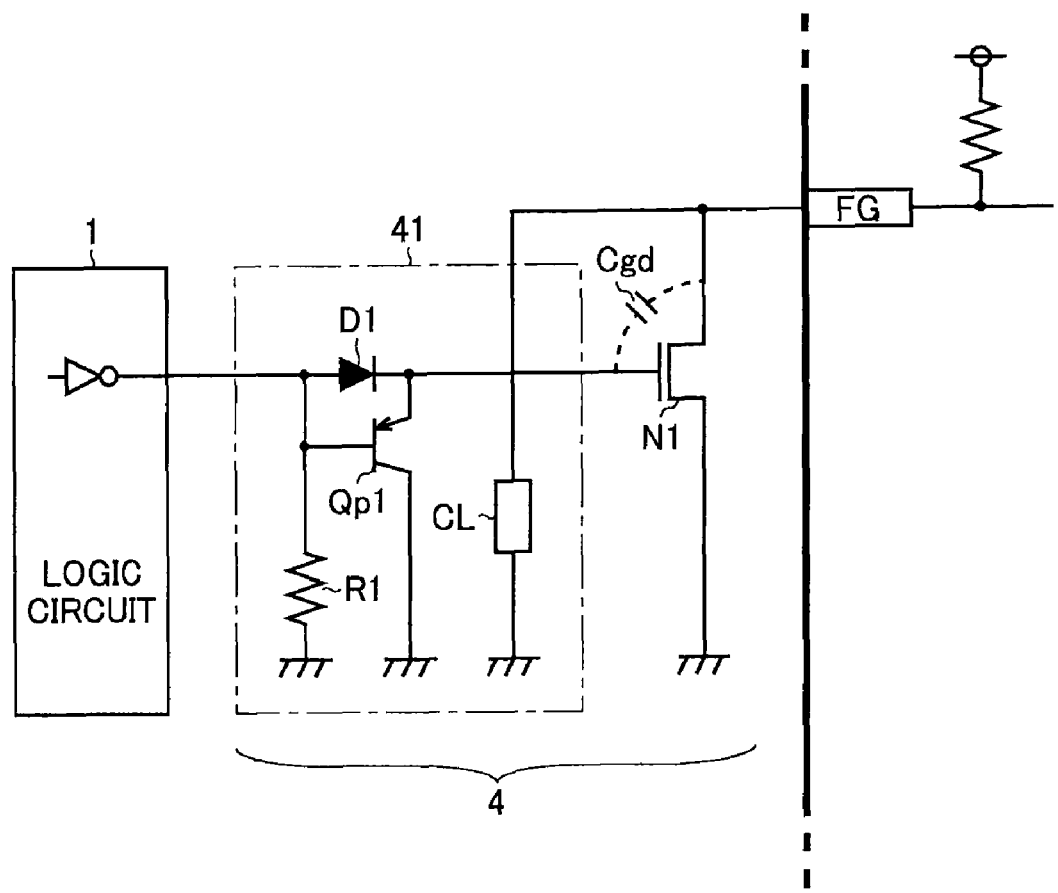
FIG. 2 A circuit diagram showing an electrostatic breakdown protection circuit 41 as a first embodiment.

FIG. 2 is a circuit diagram showing the electrostatic breakdown protection circuit 41 as the first embodiment.

As shown in FIG. 2, the electrostatic breakdown protection circuit 41 of this embodiment is composed of a diode D1, a resistor R1, a PNP bipolar transistor Qp1 and a clamp element CL.

The anode of the diode D1 is connected to a signal input terminal leading to the output transistor N1 (the output terminal of an inverter included in the output stage of the logic circuit 1). The cathode of the diode D1 is connected to the gate of the output transistor N1.

One end of the resistor R1 is connected to the signal input terminal. The other end of the resistor R1 is grounded. The resistance of the resistor R1 is set at several tens of kilohms.

The emitter of the transistor Qp1 is connected to the gate of the output transistor N1. The base of the transistor Qp1 is connected to the one end of the resistor R1. The collector of the transistor Qp1 is grounded.

The clamp element CL is connected between the FG terminal and ground, in parallel with the output transistor N1. The clamp element CL serves as a trigger element for short-circuiting between the FG terminal and ground to clamp the voltage at that terminal if an overvoltage exceeding a trigger voltage is applied to the FG terminal. The trigger voltage of the clamp element CL is set lower than the design withstand voltage of the output transistor N1. For example, in the electrostatic breakdown protection circuit 41 of this embodiment, while the design withstand voltage of the output transistor is 50 V, the trigger voltage of the clamp element CL is set at 42 V. Moreover, the clamp element is designed to withstand sufficiently high voltages so as not to be destroyed on application of an instantaneous overvoltage (such as an electrostatic pulse).

Next, how the electrostatic breakdown protection circuit 41 configured as described above operates will be described.

First, a detailed description will be given of a case where the motor driver IC is in its isolated state (in a state where electric power is not being supplied thereto).

In this case, if an electrostatic pulse or the like is applied to the FG terminal, the gate potential of the output transistor N1 is raised through the parasitic capacitance Cgd present between the gate and drain of the output transistor N1. Here, when the voltage between the gate and source of the output transistor N1 is beyond a predetermined turn-on threshold voltage (about 1.8 V), the output transistor N1 is erroneously turned on to cause an overcurrent to flow between the source and drain thereof. This may lead to breakdown of the output transistor N1.

On the other hand, in terms of the transistor Qp1, if an electrostatic pulse or the like is applied to the FG terminal, the emitter potential of the transistor Qp1 is raised through the parasitic capacitance Cgd present between the gate and drain of the output transistor N1. Here, when the voltage between the base and emitter of the transistor Qp1 is beyond a predetermined turn-on threshold voltage (about 0.7 V), the transistor Qp1 turns from off to on. Specifically, the transistor Qp1 turns on before the output transistor N1 turns on, thereby causing the gate of the output transistor N1 to be grounded. Hence, the voltage between the gate and source of the output transistor N1 does not exceed the turn-on threshold voltage, thus preventing the output transistor N1 from turning on erroneously.

With this FG signal output circuit 4 including a passive electrostatic breakdown protection circuit 41, it is possible to prevent, without the need for electric power, the gate potential from being raised through the parasitic capacitance Cgd. Thus, the open-drain output transistor N1 is prevented from erroneously turning on as a result of an electrostatic pulse or the like being applied thereto. This helps protect the open-drain output transistor N1 from electrostatic breakdown. Hence, with the motor driver IC of this embodiment, it is possible to effectively protect the output transistor N1 from electrostatic breakdown when the motor driver IC is in its isolated state. Moreover, with the electrostatic breakdown protection circuit 41 of this embodiment, it is possible to provide further gate-to-source protection and achieve a significant pull-down effect.

With the motor driver IC of this embodiment, if an overvoltage exceeding the trigger voltage of the clamp element CL is applied to the FG terminal, the clamp element CL turns on to allow the voltage at the FG terminal to be diverted to ground. Thus, it is possible to more effectively protect the output transistor N1 from electrostatic breakdown than with the configuration where such protection depends solely on the design withstand voltage of the output transistor N1.

Next, a detailed description will be given of a case where the motor driver IC is in its normal operating state (in a state where electric power is being supplied thereto).

In this case, when a high-level input signal is applied from the logic circuit 1, a current passes through the resistor R1 to ground, and thus the base potential of the transistor Qp1 is raised to turn the transistor Qp1 off. Hence, the high-level input signal is normally applied to the gate of the output transistor N1. By contrast, when a low-level input signal is applied from the logic circuit 1, the low-level input signal is normally applied to the gate of the output transistor N1 irrespective of whether the transistor Qp1 is on or off.

As described above, with the motor driver IC in its normal operating state, the electrostatic breakdown protection circuit 41 does not prevent the output transistor N1 from turning on and off.

Even when the motor driver IC is in its normal operating state, if an overvoltage exceeding the trigger voltage of the clamp element CL is applied to the FG terminal, the clamp element CL turns on to allow the voltage at the FG terminal to be diverted to ground. Thus, it is possible to more effectively protect the output transistor N1 from electrostatic breakdown than with the configuration where such protection depends solely on the design withstand voltage of the output transistor N1.

Next, the configuration and operation of the electrostatic breakdown protection circuit 41 of a second embodiment will be described in detail with reference to FIG. 3.

Figure 3:
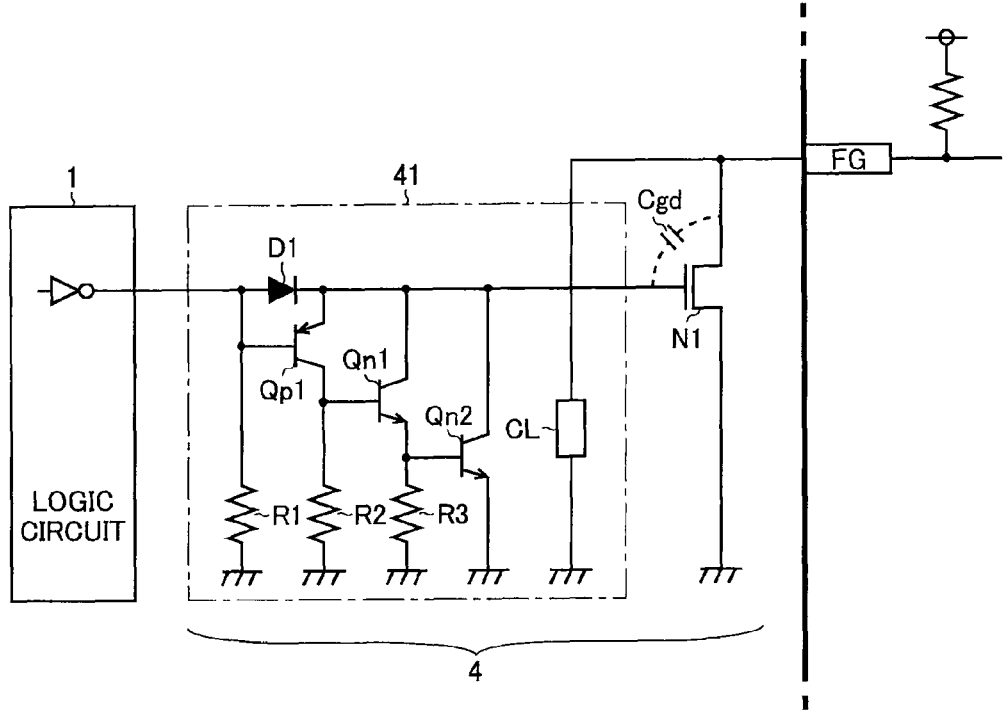
FIG. 3 A circuit diagram showing an electrostatic breakdown protection circuit 41 as a second embodiment.

FIG. 3 is a circuit diagram showing the electrostatic breakdown protection circuit 41 as the second embodiment.

The electrostatic breakdown protection circuit 41 of this embodiment is configured substantially similarly to that of the first embodiment described previously. Such parts as are found also in the first embodiment are thus identified with the same reference numerals as in FIG. 2, and no detailed description thereof will be repeated. The following description focuses on features characteristic of this embodiment.

As shown in FIG. 3, the electrostatic breakdown protection circuit 41 of this embodiment, as compared with that of the first embodiment described previously, further includes resistors R2 and R3 and NPN bipolar transistors Qn1 and Qn2.

One end of the resistor R2 is connected to the collector of the transistor Qp1. The other end of the resistor R2 is grounded.

The collector of the transistor Qn1 is connected to the gate of the output transistor N1. The emitter of the transistor Qn1 is grounded via the resistor R3. The base of the transistor Qn1 is connected to the one end of the resistor R2.

The collector of the transistor Qn2 is connected to the gate of the output transistor N1. The emitter of the transistor Qn2 is grounded. The base of the transistor Qn2 is connected to one end of the resistor R3.

Put otherwise, the electrostatic breakdown protection circuit 41 of this embodiment, as compared with that of the first embodiment described previously, further includes: a resistor R2 connected between the collector of the PNP bipolar transistor Qp1 and ground; and a plurality of stages (in this embodiment, two stages) of NPN bipolar transistors Qn1 and Qn2 connected in a Darlington configuration between the gate of the output transistor N1 and ground, with the base of the first stage NPN bipolar transistor Qn1 connected to the one end of the resistor R2.

With this configuration, when the motor driver IC is in its isolated state, if an electrostatic pulse or the like is applied to the FG terminal, the transistor Qp1 turns on to cause the transistors Qn1 and Qn2 to turn on one after the other. This allows a current to be quickly extracted from the gate of the output transistor N1. Thus, even if a sharply rising electrostatic pulse or the like is applied, the gate potential is prevented, without delay, from being raised through the parasitic capacitance Cgd. Hence, it is possible to prevent the output transistor N1 from turning on erroneously, and thus protect the output transistor N1 from electrostatic breakdown.

Although the embodiments described above discuss examples where the present invention is applied to a motor driver IC, this is in no way meant to limit the configuration with which the invention is practiced; the invention finds wide application in semiconductor integrated circuits incorporating open-drain output transistors in general.

Otherwise than specifically described by way of embodiments above, many modifications and variations are possible without departing from the spirit of the invention.

Figure 4:
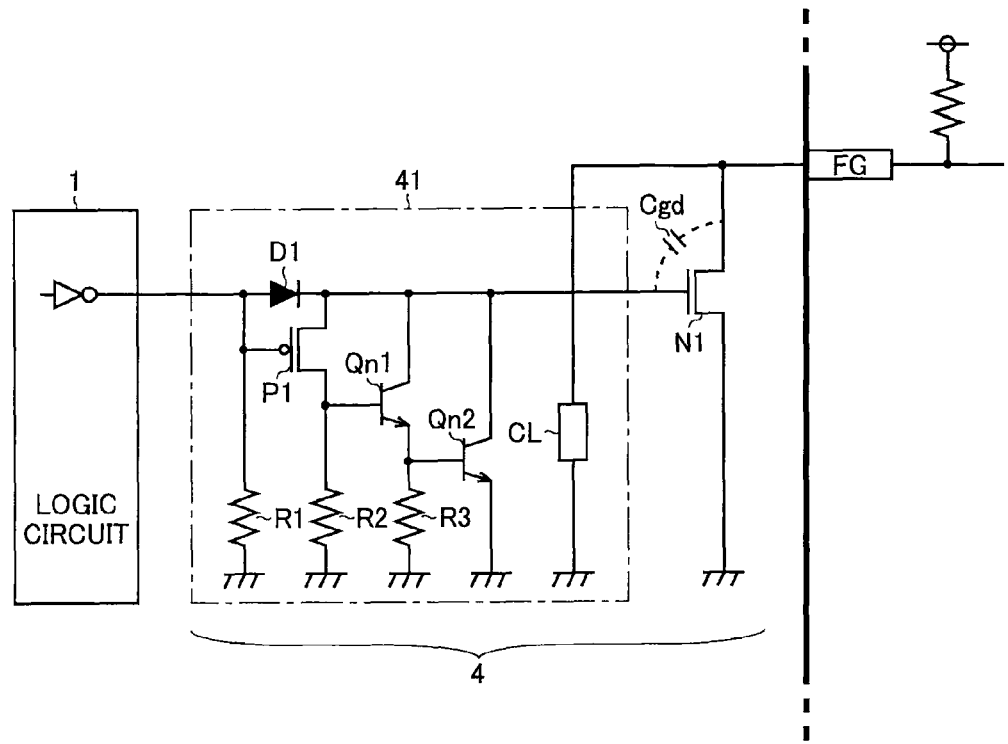
FIG. 4 A circuit diagram showing a modified example of the electrostatic breakdown protection circuit 41.

For example, although the embodiments described above discuss examples including a PNP bipolar transistor Qp1 as means for preventing the gate potential of the output transistor N1 from being raised, the invention is not limited to such configurations. As shown in FIG. 4, instead of the transistor Qp1, a P-channel field effect transistor P1 having a higher withstand voltage may be used. In a case where this configuration is adopted, it is advisable to connect the source, drain and gate of the transistor P1 to the gate of the output transistor N1, to ground and to the one end of the resistor R1, respectively.

In a case where this configuration is adopted, it is also advisable to lower the turn-on threshold voltage of the transistor P1 to less than that of the output transistor N1 so that, when the gate potential of the output transistor N1 is raised, the transistor P1 turns on before the output transistor N1 turns on. For example, if the turn-on threshold voltage of the output transistor N1 is 1.8 V, the turn-on threshold voltage of the transistor P1 is advisably set at 1.0 V so as to be less than that of the output transistor N1.

Figure 5A:
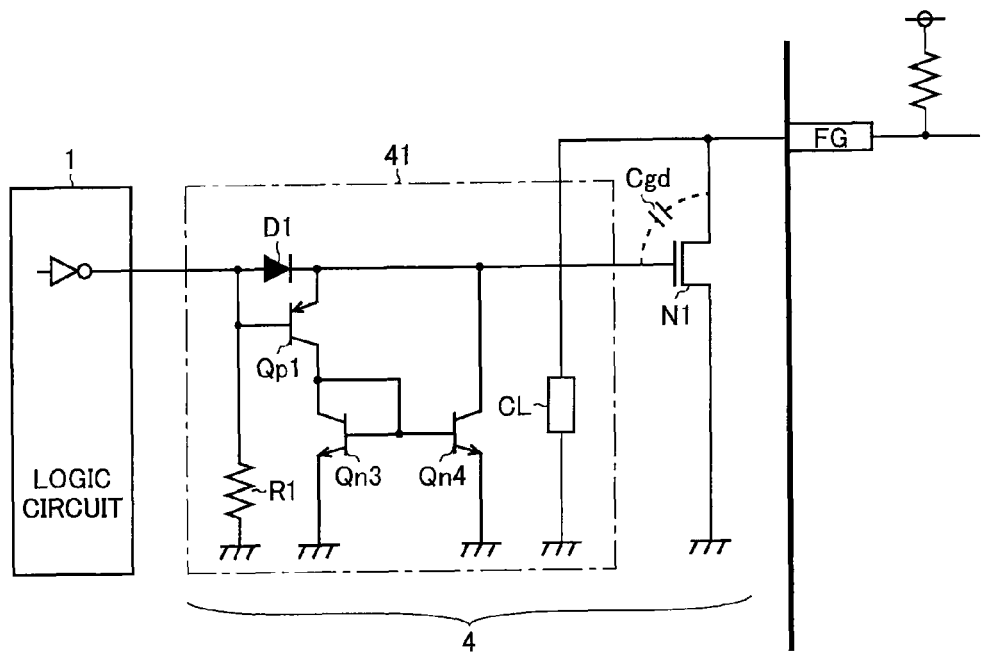
FIG. 5A A circuit diagram showing another modified example of the electrostatic breakdown protection circuit 41.
Figure 5B:
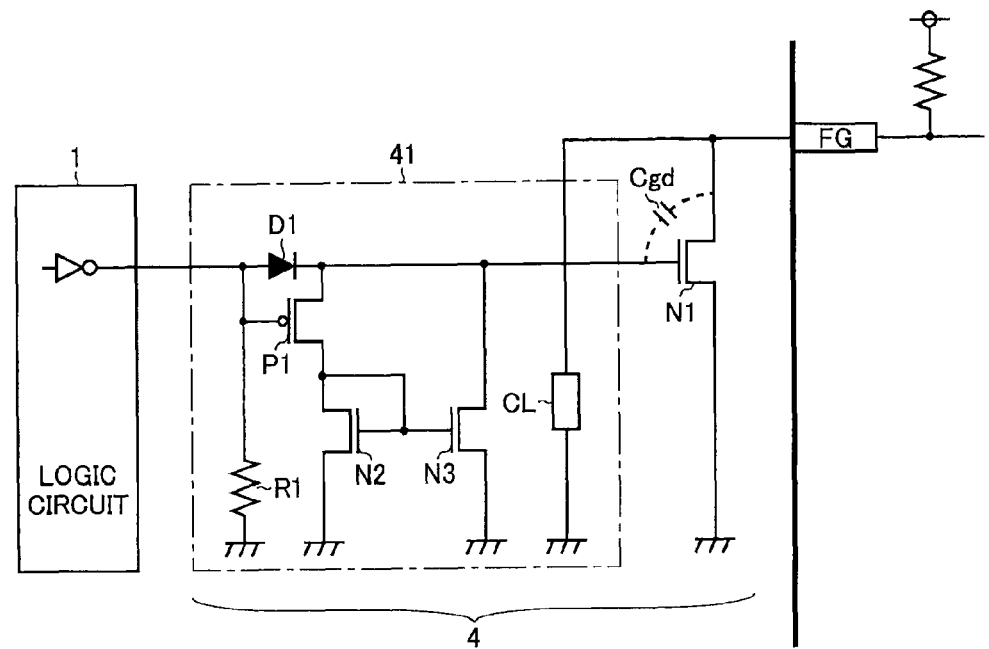
FIG. 5B A circuit diagram showing yet another modified example of the electrostatic breakdown protection circuit 41.

Although the embodiment described above discuss an example where a plurality of stages of bipolar transistors Qn1 and Qn2 connected in a Darlington configuration are used as means for quickly extracting a current from the gate of the output transistor N1, this is in no way meant to limit the configuration with which the invention is practiced; instead, as shown in FIGS. 5A and 5B, a current mirror circuit composed of bipolar transistors Qn3 and Qn4 or field effect transistors N2 and N3 may be provided.

INDUSTRIAL APPLICABILITY

The present invention offers a technology useful in achieving improved reliability and each handling of semiconductor integrated circuit devices incorporating open-drain output transistors as logic signal outputting means.

What is claimed is:

1. An electrostatic breakdown protection circuit for protecting an open-drain output transistor from electrostatic breakdown, the electrostatic breakdown protection circuit comprising:
   a diode having an anode thereof connected to a signal input terminal leading to the output transistor, and having a cathode thereof connected to a gate of the output transistor;
   a first resistor having one end thereof connected to the signal input terminal, and having the other end thereof connected to ground; and
   a PNP bipolar transistor or a P-channel field effect transistor
      having an emitter or a source thereof connected to the gate of the output transistor,
      having a base or a gate thereof connected to both the one end of the first resistor and the anode of said diode, and
      having a collector or a drain connected to ground.

2. The electrostatic breakdown protection circuit of claim 1, further comprising:
   a clamp element connected in parallel to the output transistor, a trigger voltage of the clamp element being set lower than a design withstand voltage of the output transistor.

3. The electrostatic breakdown protection circuit of claim 1, further comprising:
   a second resistor connected between the collector of the PNP bipolar transistor or the drain of the P-channel field effect transistor and ground; and
   a plurality of stages of NPN bipolar transistors connected in a Darlington configuration between the gate of the output transistor and ground, a first-stage one of the NPN bipolar transistors having a base thereof connected to one end of the second resistor.

4. A semiconductor integrated circuit device including an open-drain output transistor, an inverter for inputting a signal to a gate of the output transistor and an electrostatic breakdown protection circuit for protecting the output transistor from electrostatic breakdown,
   wherein the semiconductor integrated circuit device comprises as said electrostatic breakdown protection circuit the electrostatic breakdown protection circuit of claim 1.

5. An electrostatic breakdown protection circuit for protecting an open-drain output transistor from electrostatic breakdown, the electrostatic breakdown protection circuit comprising:
   a diode having an anode thereof connected to a signal input terminal leading to the output transistor, and having a cathode thereof connected to a gate of the output transistor;
   a first resistor having one end thereof connected to the signal input terminal, and having the other end thereof connected to ground;
   a PNP bipolar transistor or a P-channel field effect transistor having an emitter or a source thereof connected to the gate of the output transistor, having a base or a gate thereof connected to the one end of the first resistor, and having a collector or a drain connected to ground;
   a second resistor connected between the collector of the PNP bipolar transistor or the drain of the P-channel field effect transistor and ground; and
   a plurality of stages of NPN bipolar transistors connected in a Darlington configuration between the gate of the output transistor and ground, a first-stage one of the NPN bipolar transistors having a base thereof connected to one end of the second resistor.

6. A semiconductor integrated circuit device comprising an open-drain output transistor, an inverter for inputting a signal to a gate of the output transistor and an electrostatic breakdown protection circuit for protecting the output transistor from electrostatic breakdown, wherein the semiconductor integrated circuit device comprises:

a diode having an anode thereof connected to a signal input terminal leading to the output transistor, and having a cathode thereof connected to a gate of the output transistor;

a first resistor having one end thereof connected to the signal input terminal, and having the other end thereof connected to ground; and a PNP bipolar transistor or a P-channel field effect transistor having an emitter or a source thereof connected to the gate of the output transistor, having a base or a gate thereof connected to the one end of the first resistor, and having a collector or a drain connected to ground.

* * * * *